(12) United States Patent
Schegner et al.

(10) Patent No.: US 11,088,526 B2
(45) Date of Patent: Aug. 10, 2021

(54) ARCING FAULT RECOGNITION UNIT

(71) Applicant: Siemens Aktiengesellschaft, Munich (DE)

(72) Inventors: Peter Schegner, Dresden (DE); Jörg Meyer, Dresden (DE); Karsten Wenzlaff, Dresden (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 340 days.

(21) Appl. No.: 16/305,109

(22) PCT Filed: May 31, 2016

(86) PCT No.: PCT/EP2016/062273
§ 371 (c)(1),
(2) Date: Nov. 28, 2018

(87) PCT Pub. No.: WO2017/207031
PCT Pub. Date: Dec. 7, 2017

(65) Prior Publication Data
US 2020/0321768 A1    Oct. 8, 2020

(51) Int. Cl.
*H02H 1/00* (2006.01)
*H02H 3/44* (2006.01)
(Continued)

(52) U.S. Cl.
CPC ....... *H02H 1/0015* (2013.01); *G01R 19/0092* (2013.01); *G01R 31/1272* (2013.01);
(Continued)

(58) Field of Classification Search
CPC .......... H02H 1/0015; H02H 3/44; H02H 3/50; H02H 9/02; G01R 19/0092; G01R 31/1272
(Continued)

(56) References Cited

U.S. PATENT DOCUMENTS

| | | | |
|---|---|---|---|
| 4,780,789 A | 10/1988 | Kugler et al. | |
| 5,726,577 A | 3/1998 | Engel et al. | |

(Continued)

FOREIGN PATENT DOCUMENTS

| | | |
|---|---|---|
| CA | 1210847 A | 9/1986 |
| CN | 101395777 A | 3/2009 |

(Continued)

OTHER PUBLICATIONS

U.S. Office Action for copending U.S. Appl. No. 16/305,102 dated Dec. 21, 2020.
(Continued)

*Primary Examiner* — Dharti H Patel
(74) *Attorney, Agent, or Firm* — Harness, Dickey & Pierce, P.L.C.

(57) ABSTRACT

An arcing fault recognition unit is for an electric low-voltage circuit. In an embodiment, the arcing fault recognition unit includes at least one current sensor for periodically ascertaining electric current values in the electric circuit, the current sensor being connected to an analysis unit which is designed in such a way that an arcing fault recognition signal is output when a variation in the rate of current rise exceeds a first threshold value or drops below a second threshold value.

23 Claims, 3 Drawing Sheets

(51) Int. Cl.
*H02H 3/50* (2006.01)
*H02H 9/02* (2006.01)
*G01R 19/00* (2006.01)
*G01R 31/12* (2020.01)

(52) U.S. Cl.
CPC .............. *H02H 3/44* (2013.01); *H02H 3/50* (2013.01); *H02H 9/02* (2013.01)

(58) Field of Classification Search
USPC .......................................................... 361/1
See application file for complete search history.

(56) References Cited

U.S. PATENT DOCUMENTS

| | | | |
|---|---|---|---|
| 6,654,219 | B1 | 11/2003 | Romano et al. |
| 6,987,389 | B1 | 1/2006 | Macbeth et al. |
| 7,268,989 | B2 | 9/2007 | Parker et al. |
| 2005/0017731 | A1 | 1/2005 | Zuercher et al. |
| 2006/0012931 | A1 | 1/2006 | Engel et al. |
| 2006/0227469 | A1 | 10/2006 | Parker et al. |
| 2007/0086124 | A1 | 4/2007 | Elms et al. |
| 2007/0208520 | A1 | 9/2007 | Zhang et al. |
| 2008/0106832 | A1 | 5/2008 | Restrepo et al. |
| 2008/0129307 | A1 | 6/2008 | Yu et al. |
| 2009/0040665 | A1 | 2/2009 | Elms et al. |
| 2011/0019444 | A1 | 1/2011 | Dargatz et al. |
| 2011/0128005 | A1 | 6/2011 | Weiher |
| 2012/0056637 | A1 | 3/2012 | Jeong et al. |
| 2012/0134058 | A1 | 5/2012 | Pamer et al. |
| 2013/0169290 | A1 | 7/2013 | Shea |
| 2014/0071575 | A1* | 3/2014 | Parker .................... H01H 71/04 361/115 |
| 2014/0160603 | A1 | 6/2014 | Parker |
| 2014/0247066 | A1 | 9/2014 | Chaintreuil et al. |
| 2016/0111870 | A1 | 4/2016 | Murano et al. |
| 2016/0187410 | A1 | 6/2016 | Kolker et al. |
| 2016/0241017 | A1* | 8/2016 | Schroeder ................ H02H 3/28 |

FOREIGN PATENT DOCUMENTS

| | | |
|---|---|---|
| CN | 101523681 A | 9/2009 |
| CN | 101573847 A | 11/2009 |
| CN | 101696986 A | 4/2010 |
| CN | 102401869 | 4/2012 |
| CN | 102565578 A | 7/2012 |
| CN | 102916415 A | 2/2013 |
| CN | 103635820 A | 3/2014 |
| CN | 103645396 A | 3/2014 |
| CN | 203774769 U | 8/2014 |
| CN | 104620349 A | 5/2015 |
| CN | 204462364 U | 7/2015 |
| CN | 104898008 A | 9/2015 |
| CN | 105445587 A | 3/2016 |
| DE | 102013001612 A1 | 8/2013 |
| EP | 0509652 A2 | 10/1992 |
| EP | 0802602 A2 | 10/1997 |
| EP | 2426802 A2 | 3/2012 |
| EP | 2916455 A1 | 9/2015 |
| GB | 2510871 A | 8/2014 |
| TW | 217471 B | 12/1993 |
| WO | WO-2008146040 A1 | 12/2008 |
| WO | WO-2009008871 A1 | 1/2009 |
| WO | WO-2009/156513 A1 | 12/2009 |

OTHER PUBLICATIONS

Chinese Office Action and English translation thereof for Chinese Application No. 2017800461033 dated Jul. 25, 2019.
Chinese Office Action and English translation thereof for Chinese Application No. 2016800879980 dated Jul. 18, 2019.
Chinese Office Action and English translation thereof dated Jul. 2, 2019.
U.S. Notice of Allowance for corresponding U.S. Appl. No. 16/305,102 dated Mar. 3, 2021.
Chinese Office Action and English translation thereof for Chinese Application No. 2016800877078 dated Sep. 2, 2019.
International Search Report PCT/ISA/210 for International Application No. PCT/EP2016/062271 dated May 31, 2016.
International Search Report PCT/ISA/210 for International Application No. PCT/EP2016/062272 dated May 31, 2016.
International Search Report PCT/ISA/210 for International Application No. PCT/EP2016/062274 dated May 31, 2016.
International Search Report PCT/ISA/210 for International Application No. PCT/EP2017/062980 dated May 30, 2017.
Chinese Office Action and English translation thereof dated Jul. 18, 2019.
PCT International Search Report and Written Opinion of International Searching Authority dated Feb. 24, 2017 corresponding to PCT International Application No. PCT/EP2016/062273 filed May 31, 2016.
U.S. Notice of Allowance for corresponding U.S. Appl. No. 16/305,120 dated Apr. 5, 2021.
U.S. Office Action for corresponding U.S. Appl. No. 16/305,131 dated Apr. 19, 2021.
U.S. Office Action for corresponding U.S. Appl. No. 16/305,132 dated Jun. 8, 2021.

* cited by examiner

ARCING FAULT RECOGNITION UNIT

PRIORITY STATEMENT

This application is the national phase under 35 U.S.C. § 371 of PCT International Application No. PCT/EP2016/062273 which has an International filing date of May 31, 2016, which designated the United States of America, the entire contents of which are hereby incorporated herein by reference.

FIELD

Embodiments of the invention generally relate to a fault arc detection unit, a circuit breaker, a short-circuiter and a method for fault arc detection.

BACKGROUND

In low voltage circuits or low voltage installations, or low voltage systems, i.e. circuits for voltages up to 1000 volts AC or 1500 volts DC, short circuits are for the most part linked to fault arcs that arise, such as parallel or series fault arcs. Particularly in powerful distribution installations and switchgear, these can lead to devastating destruction of resources, installation parts or complete switchgear if shutdown is not fast enough. To avoid lengthy and extensive failure of the power supply and reduce injury to persons, it is necessary to detect and extinguish such fault arcs, in particular high-current or parallel fault arcs, in a few milliseconds. Conventional protection systems of power supply installations (e.g. fuses and circuit breakers) cannot afford reliable protection under the obligatory time constraints.

In this context, circuit breakers means in particular switches for low voltage. Circuit breakers, in particular in low voltage installations, are usually used for currents of from 63 to 6300 amps. More specifically, enclosed circuit breakers, such as molded case circuit breakers, are used for currents of from 63 to 1600 amps, in particular from 125 to 630 or 1200 amps. Exposed circuit breakers, such as air circuit breakers, are used in particular for currents of from 630 to 6300 amps, more specifically from 1200 to 6300 amps.

Circuit breakers within the meaning of embodiments of the invention can have in particular an electronic trip unit, also referred to an ETU for short.

Circuit breakers monitor the current flowing through them and interrupt the electric current or flow of energy to an energy sink or a load, referred to as tripping, when current limit values or current/period limit values, i.e. when a current value is present for a certain period, are exceeded. Trip conditions can be ascertained and a circuit breaker tripped via an electronic trip unit.

Short-circuiters are specific devices for shorting lines or power rails in order to produce defined shorts to protect circuits and installations.

Conventional fault arc detection systems evaluate the emission of light produced by the arc and thereby detect the fault arc.

SUMMARY

The inventors have recognized that the conventional fault arc detection systems have a disadvantage that optical fibers or optical detection systems need to be laid parallel to the electrical lines or power rails in order to detect any fault arcs that occur.

At least one embodiment of the present invention demonstrates an opportunity for fault arc detection.

Embodiments of the present invention are directed to a fault arc detection unit, a circuit breaker, a short-circuiter and a method.

According to at least one embodiment of the invention, there is provision for a fault arc detection unit for a low voltage electrical circuit to have at least one current sensor, for periodically ascertaining electrical current variables of the electrical circuit, and an evaluation unit connected thereto. The evaluation unit is configured such that a difference in the current rise that is above a first threshold value (SW1) or below a second threshold value (SW2) results in a fault arc detection signal (SLES) being delivered.

According to at least one embodiment of the invention, a circuit breaker for a low voltage electrical circuit is further provided. The circuit breaker has a fault arc detection unit according to at least one embodiment of the invention. The fault arc detection unit is connected to the circuit breaker, these being configured such that delivery of a fault arc detection signal results in the circuit breaker tripping, i.e. interrupting the electrical circuit. Extinguishing of the fault arc can therefore be achieved. If the circuit breaker has an electronic trip unit, very fast tripping of the circuit breaker can be achieved when a fault arc detection signal is present. This has the particular advantage that a circuit breaker is extended by a further, advantageous functionality for protecting electrical installations. In this instance, the detection and isolation of fault arcs are advantageously effected in one device. If need be, available assemblies, such as current sensors, power supply unit, microprocessors for the evaluation unit, etc., can also be used and can thus attain synergies.

According to at least one embodiment of the invention, a short-circuiter, having a fault arc detection unit connected to the short-circuiter, is further provided. These are configured such that delivery of a fault arc detection signal results in the short-circuiter shorting the electrical circuit in order to cause extinguishing of the fault arc.

According to at least one embodiment of the invention, a method for fault arc detection for an electrical circuit is furthermore provided. This involves periodically ascertaining electrical current variables, with which or from which a difference in the current rise is continually ascertained. This difference is continually compared with a threshold value, and a change in the current rise that is above a first threshold value (SW1) or below a second threshold value (SW2) results in a fault arc detection signal being delivered. That is to say that only one of the two criteria needs to be implemented. Both may be implemented, however, in order to achieve better detection.

According to at least one embodiment of the invention, a method for fault-arc detection for an electrical circuit, comprising:
  periodically ascertaining electrical current variables;
  comparing a difference in a current rise, of the electrical voltage values periodically ascertained, to a first threshold value;
  comparing the difference in the current rise, of the electrical voltage values periodically ascertained, to a second threshold value; and
  delivering a fault arc detection signal upon the comparing indicating the difference in the current rise, of the electrical voltage values periodically ascertained, being above the first threshold or below the second threshold.

BRIEF DESCRIPTION OF THE DRAWINGS

The described properties, features and advantages of this invention and the way in which they are achieved will become clearer and more distinctly comprehensible in conjunction with the description of the exemplary embodiments that follows, the exemplary embodiments being explained in more detail in conjunction with the drawings, in which.

DETAILED DESCRIPTION OF THE EXAMPLE EMBODIMENTS

Figure 1:
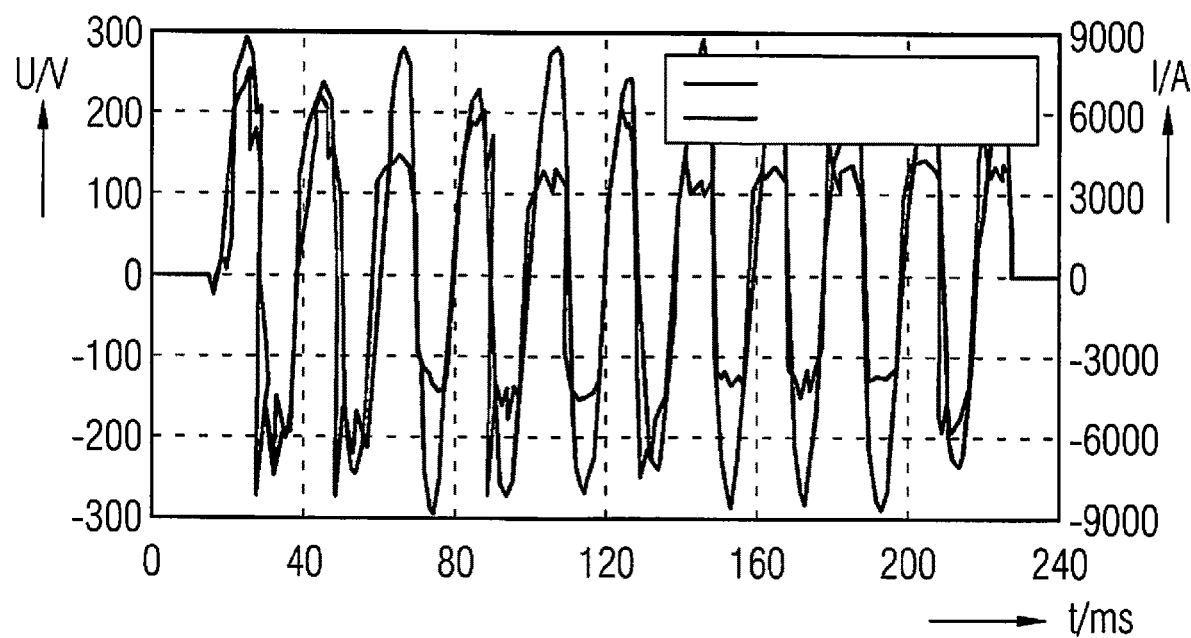
FIG. 1 shows a graph of the voltage and current waveforms following arc ignition.

According to at least one embodiment of the invention, there is provision for a fault arc detection unit for a low voltage electrical circuit to have at least one current sensor, for periodically ascertaining electrical current variables of the electrical circuit, and an evaluation unit connected thereto. The evaluation unit is configured such that a difference in the current rise that is above a first threshold value (SW1) or below a second threshold value (SW2) results in a fault arc detection signal (SLES) being delivered.

A fundamental aspect of at least one embodiment is that changes in the current rise whose differences are above or below certain threshold values are detected and lead to a fault arc detection signal, i.e. if the differences in the current rise are above/below the usual differences in the current rise. In this instance, usual current rise means, by way of example, the sinusoidal current rise in the AC current in a standard circuit, for example a low voltage circuit, e.g. at 230/400 volts rated voltage and 50 Hz mains frequency, the rise in the ideally sinusoidal current being meant in the case of the cited low voltage circuit. Fault arcs have reductions in the current rise when the arc ignites. These are detected according to the invention and lead to a fault arc detection signal.

Advantageous configurations of embodiments of the invention are specified in the claims.

In one advantageous configuration of at least one embodiment of the invention, the electrical current variable ascertained is either an electrical current value (in) and/or a value for the change in the electric current with respect to time (i'n), or difference quotient (dqin). It is thus possible for the current value to be ascertained by a standard current sensor, for example. The change in the electric current with respect to time can be provided by a Rogowski coil, for example.

This has the advantage that both standard current sensors and current change sensors can be used for at least one embodiment of the invention.

In one advantageous configuration of at least one embodiment of the invention, if current values are ascertained then a current difference (din) is continually ascertained from two temporally successive current values (in, in−1), and the current difference (din) is divided by the difference in the current values with respect to time (dtn) in order thus to ascertain a difference quotient (dqin) as a value for the change in the electric current with respect to time.

This has the particular advantage that there is a particularly simple opportunity for ascertainment of the change in the electric current with respect to time.

In one advantageous configuration of at least one embodiment of the invention, the difference in two difference quotients (dqin, dqin−1) is ascertained. In this instance, the preceding difference quotient can be subtracted from the present difference quotient (dqin), and vice versa. This merely changes the arithmetic sign of the thus ascertained difference (Ddqin) in the difference quotients, which, as a measure of the difference in the current rise, is compared with the first threshold value (SW1), and values above the first threshold value result in the fault arc detection signal (SLES) being delivered.

This has the particular advantage that a difference for which the preceding difference quotient is subtracted from the present difference quotient (dqin) results in detection of a fault arc being possible insofar as changes in the difference in the current rise for a falling edge are detected, since the difference is positive.

In one advantageous configuration of at least one embodiment of the invention, the difference in two difference quotients (dqin, dqin−1) is ascertained. In this instance, the preceding difference quotient can be subtracted from the present difference quotient (dqin), and vice versa. This merely changes the arithmetic sign of the thus ascertained difference (Ddqin) in the difference quotients, which, as a measure of the difference in the current rise, is compared with the second threshold value (SW2), and values below the second threshold value result in a fault arc detection signal being delivered.

This has the particular advantage that a difference for which the preceding difference quotient is subtracted from the present difference quotient (dqin) results in detection of a fault arc being possible insofar as changes in the difference in the current rise for a rising edge are detected, since the difference is negative.

In one advantageous configuration of at least one embodiment of the invention, the difference in two difference quotients (dqin, dqin−1) is ascertained. In this instance, the present difference quotient (dqin) can be subtracted from the preceding difference quotient (dqin−1), and vice versa, with merely the arithmetic sign changing.

The magnitude of the thus ascertained difference (Ddqin) in the difference quotients as a measure of the difference in the current rise is compared with the first threshold value (SW1), and values above the first threshold value result in a fault arc detection signal being delivered.

This has the particular advantage that detection of a fault arc is possible in consideration of both positive and negative changes in the difference in the current with reductions in the current rise. There is therefore an opportunity for ascertainment available for both rising and falling edges of the electric current, in particular in the case of AC current.

In one advantageous configuration of at least one embodiment of the invention, the current variable, in particular the current value (in), is compared with a third threshold value (SW3) and only values above the third threshold value result in a fault arc detection signal being delivered. That is to say that a further criterion must be satisfied, a value above the third threshold value (SW3), before a fault arc detection signal is delivered.

This has the particular advantage that more accurate detection of fault arcs is enabled, since they frequently occur only at higher currents. It is therefore possible for erroneous fault arc detection signals to be avoided, e.g. when a reduction in the current rise occurs in normal operation.

As an alternative or in addition to the third threshold value, another criterion may also be satisfied, for example the presence of an audible and/or visual fault arc signal. This can be linked to the previous one in an analogous manner. Thus, more accurate detection of a fault arc is possible on the basis of at least two criteria, this avoiding erroneous shutdown on the basis of only one criterion.

According to at least one embodiment of the invention, a circuit breaker for a low voltage electrical circuit is further provided. The circuit breaker has a fault arc detection unit according to at least one embodiment of the invention. The fault arc detection unit is connected to the circuit breaker, these being configured such that delivery of a fault arc detection signal results in the circuit breaker tripping, i.e. interrupting the electrical circuit. Extinguishing of the fault arc can therefore be achieved. If the circuit breaker has an electronic trip unit, very fast tripping of the circuit breaker can be achieved when a fault arc detection signal is present. This has the particular advantage that a circuit breaker is extended by a further, advantageous functionality for protecting electrical installations. In this instance, the detection and isolation of fault arcs are advantageously effected in one device. If need be, available assemblies, such as current sensors, power supply unit, microprocessors for the evaluation unit, etc., can also be used and can thus attain synergies.

According to at least one embodiment of the invention, a short-circuiter, having a fault arc detection unit connected to the short-circuiter, is further provided. These are configured such that delivery of a fault arc detection signal results in the short-circuiter shorting the electrical circuit in order to cause extinguishing of the fault arc.

This has the particular advantage that there is a simple, fast and effective opportunity available for extinguishing fault arcs.

According to at least one embodiment of the invention, a method for fault arc detection for an electrical circuit is furthermore provided. This involves periodically ascertaining electrical current variables, with which or from which a difference in the current rise is continually ascertained. This difference is continually compared with a threshold value, and a change in the current rise that is above a first threshold value (SW1) or below a second threshold value (SW2) results in a fault arc detection signal being delivered. That is to say that only one of the two criteria needs to be implemented. Both may be implemented, however, in order to achieve better detection.

This has the particular advantage of a simple method for fault arc detection.

All configurations and features of the invention bring about an improvement in the detection of fault arcs or the extinguishing thereof.

In a circuit or system in which there is a fault arc, a current and voltage profile can be measured that has a significant trend. A typical voltage and current profile for a fault arc is depicted in FIG. 1. FIG. 1 shows a depiction of a graph in which the waveform of the voltage (U) and the electric current (I) following ignition of an arc or fault arc, in particular a parallel fault arc, in an electrical circuit, in particular a low voltage circuit, is depicted.

The horizontal X axis depicts the time (t) in milliseconds (ms). The vertical Y axis depicts the magnitude of the voltage (U) in volts (V) on the left-hand scale. The right-hand scale depicts the magnitude of the electric current (I) in amps (A).

Following arc ignition, the current (I) has an approximately sinusoidal profile. The voltage (U) in this instance has a "serrated" profile, with rapid voltage changes. Broadly interpreted, the voltage profile is in the form of a squarewave in a first approximation, instead of the usually sinusoidal profile.

In contrast to the voltage profile, the current profile of a fault arc has an almost sinusoidal trend. At the time of the arc ignition, there is a reduction in the current rise, however, which can be explained by the physical, current-limiting effect of arcs. Additionally, a significant rise change occurs in the current profile at every further current zero crossing after ignition of an arc. This significant property in the current profile is meant to be detected by an evaluation unit AE1 according to an embodiment of the invention.

The change or reduction in the current rise can be detected by way of a calculation according to an embodiment of the invention, for example. In this regard, current values (in, in−1) are periodically measured or sampled. Sampling or measurement needs to take place at a multiple of the frequency of the AC current used, for example at frequencies in the range from 1 to 200 kHz, more specifically in the range 10 to 40 or 60 kHz, in particular in the range 40 to 50 kHz. It is recommended to measure the current profile and the current change profile at a sampling frequency of 40-50 kHz in order to ahieve the shortest possible detection times.

The change in the current rise can be made by way of calculation of the difference quotient dqin for:

$$dqin = \frac{i_n - i_{n-1}}{t_n - t_{n-1}} = \frac{din}{din} \quad (1)$$

This involves a current difference din being continually calculated for two temporally successive current values (in, in−1). The current difference din is divided by the difference in the current values dtn (=tn−tn−1) with the respect to time. This results in the difference quotient dqin.

The difference is continually calculated from two successive calculation results for the difference quotients dqin and dqin−1, so that the difference in the difference quotient Ddqin is obtained.

$$Ddqin = dqin - (dqin-1) \quad (2)$$

As an alternative to formula 1, the preceding current value (in−1) can also be deducted from the present current value (in).

Similarly, as an alternative to formula 2, the present difference quotient (dqin) can be deducted from the preceding difference quotient (dqin−1). In this case, only the arithmetic sign of the resultant difference quotient or the difference changes.

If not the magnitude but rather the absolute value of the difference is compared with a threshold value, it may also be necessary to pay attention to the correct arithmetic sign of the threshold value.

If, instead of current values, the change in the current with respect to time is ascertained, for example using a Rogowski coil, these values can be directly used as a difference quotient, which means that the difference can be calculated directly.

By evaluating the difference in the difference quotient Ddqin, a threshold value comparison can be used to make a distinction between "no fault arc burning" and "fault arc burning" in the installation and to deliver an appropriate fault arc detection signal SLES or display a piece of information.

By way of example, a first current value at 5011 A, a subsequent second current value at 5058 A, a subsequent third current value at 5105 A and a subsequent fourth current value at 5120 A were measured, each time at an interval of 20 μs, which is consistent with a sampling frequency at 50 kHz. That is to say that there is a rising edge of the electric current.

This results in the following difference quotients:

$$dqin-2 = \frac{5058\ A - 5011\ A}{20\ \mu s} = \frac{47\ A}{20\ \mu s} = 2.35\ A/\mu s$$

$$dqin-1 = \frac{5105\ A - 5058\ A}{20\ \mu s} = \frac{47\ A}{20\ \mu s} = 2.35\ A/\mu s$$

$$dqin = \frac{5120\ A - 5105\ A}{20\ \mu s} = \frac{15\ A}{20\ \mu s} = 0.75\ A/\mu s$$

This results in the difference in the difference quotients of:

$$Ddqin-1 = 2.35\frac{A}{\mu s} - 2.35\frac{A}{\mu s} = 0\frac{A}{\mu s}$$

$$Ddqin = 0.75\frac{A}{\mu s} - 2.35\frac{A}{\mu s} = -1.6\frac{A}{\mu s}$$

The second threshold value SW2 may be −0.25 A/μs, for example. The first threshold value can have the same positive magnitude, for example. Since the last difference in the difference quotient (Ddqin) is below the second threshold value, a fault arc detection signal is delivered.

That is to say that the fourth current value, at which a significant decrease in the electric current occurs, results in a fault arc detection signal being delivered.

If the present value is deducted from the subsequent value or the minuend and the subtrahend are interchanged for the differences, the respective arithmetic signs changes, this being able to be taken into consideration for applying the threshold values when an absolute value comparison is performed. If the magnitudes are used, an evaluation can be effected using just one threshold value.

Satisfaction of the threshold value condition results in a fault arc detection signal. A corresponding evaluation is depicted in FIG. 2.

Figure 2:
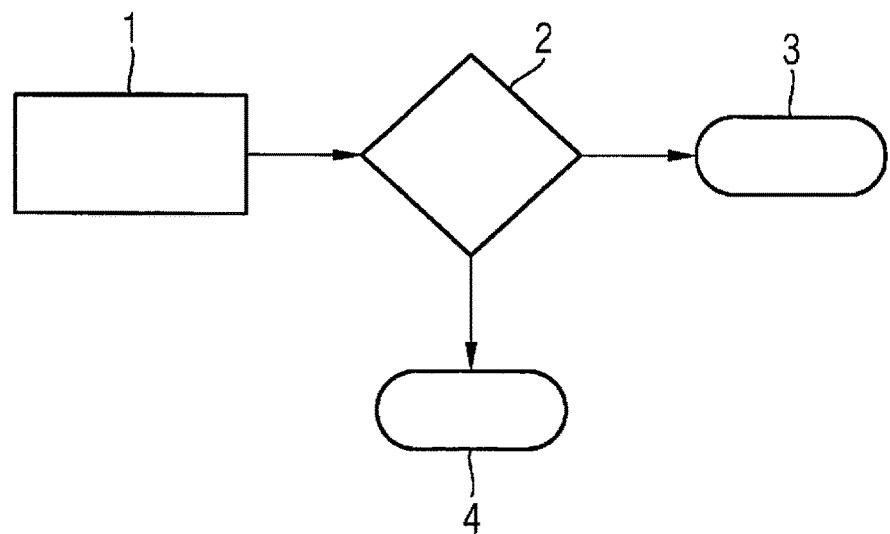
FIG. 2 shows a flowchart for fault arc detection.

According to FIG. 2, a first step (1) involves the difference in the difference quotient of the current Ddqin being continually calculated. A second step (2) involves this being compared with the first threshold value (SW1). If a value above the first threshold value (SW1) is obtained, a third step (3) involves a fault arc being detected and/or a fault arc detection signal being delivered. If no values above the first threshold value (SW1) are obtained, a fourth step (4) can involve it being reported that there is no fault arc present.

The calculation can be performed continually.

By way of example, according to one configuration, when signed change variables for the current are calculated, the comparison can be effected for positive values in consideration of their being above a first, for example positive, threshold value (SW1) and/or for negative values in consideration of their being below a second, for example negative, threshold value (SW2), that is to say if the magnitude of the negative difference is numerically greater than the magnitude of the negative threshold value.

Alternatively, a magnitude (positive) can also be formed from the difference in the change of current, which magnitude is then compared with the positive first threshold value (SW1), and a value above the first threshold value results in a fault arc detection signal being delivered.

As an alternative or in addition to the fault arc detection signal, it is also possible for either "no fault arc present" or "fault arc present" to be indicated, or for a corresponding distinction to be drawn in the installation.

In addition, the fault arc detection according to an embodiment of the invention can be combined with further criteria, for example with a further comparison of the level of the electric current of the circuit. The measured current, in particular the RMS value of the measured current, which can be calculated using the Mann-Morrison method, for example, is in this instance compared with a third threshold value (SW3), and only if it is also above this third threshold value (SW3) and the criterion for a fault arc detection signal is satisfied is such a signal also delivered. This criterion, referred to as overcurrent release, leads to reliable fault localization. Fault arc detection requires a minimum fault arc current flow in the circuit in order to give rise to a fault arc detection signal. The threshold value chosen for the overcurrent release may be a value dependent on the operating current. Alternatively, the threshold values could also be stipulated in a manner specific to arcs, since a burning parallel low voltage arc requires an arc current of 1000 A, for example. That is to say that the third threshold value SW3 can take a value upward of 1 A, 10 A, 100 A, 1000 A or 5000 A, depending on the use or application.

Figure 3:
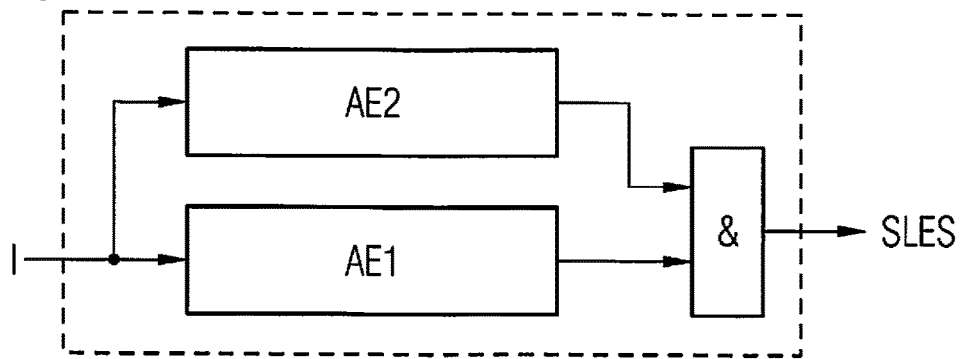
FIG. 3 shows a block diagram of a solution according to an embodiment of the invention.

In this regard, FIG. 3 shows a depiction in which the ascertained current I of the circuit is supplied to a first evaluation unit AE1, for ascertaining fault arcs, and to a second evaluation unit AE2, for ascertaining a current condition, such as a value above the third current limit value SW3.

The outputs of the two units are linked to an AND unit &, the output of which delivers a fault arc detection signal SLES when both criteria are satisfied.

In addition, a fault arc detection signal can be delivered only when the difference in the difference quotient is above a threshold value at least twice. Analogously, also only values above a threshold value three times, four times, five times, etc. can lead to a fault arc detection signal. This achieves particularly reliable evaluation and detection of a fault arc. Analogously, the evaluation can be performed after a zero crossing. That is to say that after each zero crossing the check according to the invention for the change in the current rise is performed and only after two, three or more differences is a fault arc detection signal delivered.

Figure 4:
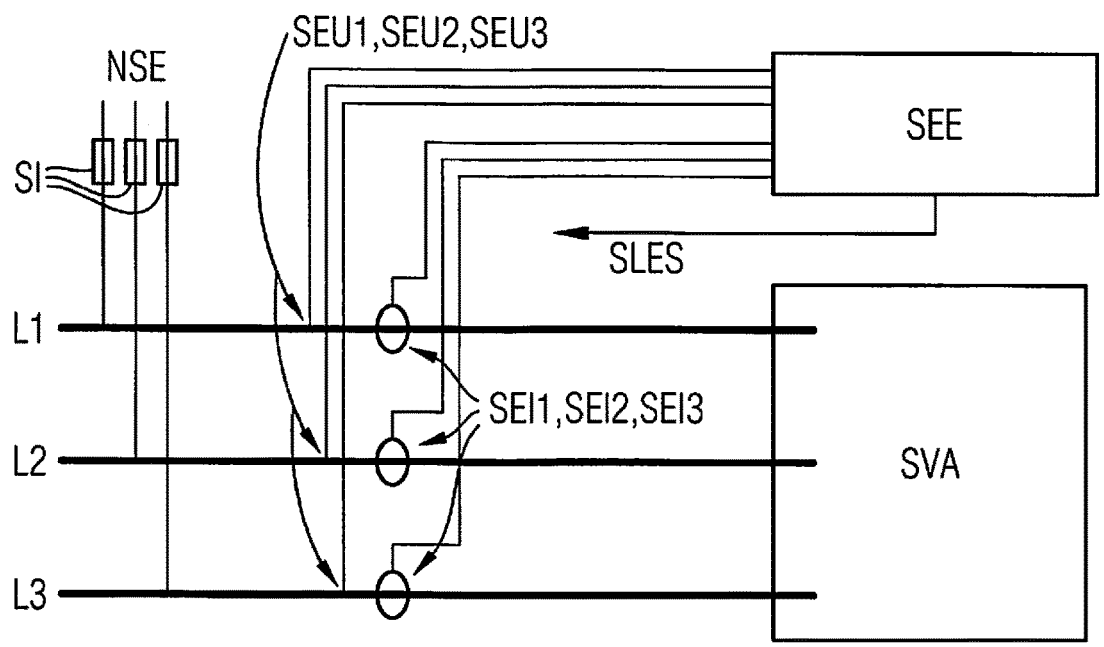
FIG. 4 shows a first depiction to explain the use of an embodiment of the invention.

FIG. 4 shows a schematic depiction of an outline circuit diagram for an installation configuration with an outgoing-circuit-selective fault arc detection unit for detecting fault arcs. FIG. 4 shows a low voltage incoming unit NSE, with fuses SI, which are followed by busbars L1, L2, L3 for the conductors of a three-phase AC system or circuit. The neutral conductor is not depicted. Each of the three busbars L1, L2, L3 has a respective associated voltage sensor SEU1, SEU2, SEU3 and current sensor SEI1, SEI2, SEI3. The busbars are connected to switchgear and/or a distribution installation SVA.

The voltage and current sensors are connected to a fault arc detection unit SEE according to the invention, which has an evaluation unit AE according to the invention. The latter has an output for delivering a fault arc detection signal SLES.

The voltage and current sensors ascertain voltage values (un, un−1) and current values (in, in−1) for the busbars L1, L2, L3 and supply them to the fault arc detection unit SEE according to the invention.

The sensors in this instance are arranged outside the fault arc detection unit and connected thereto.

Figure 5:
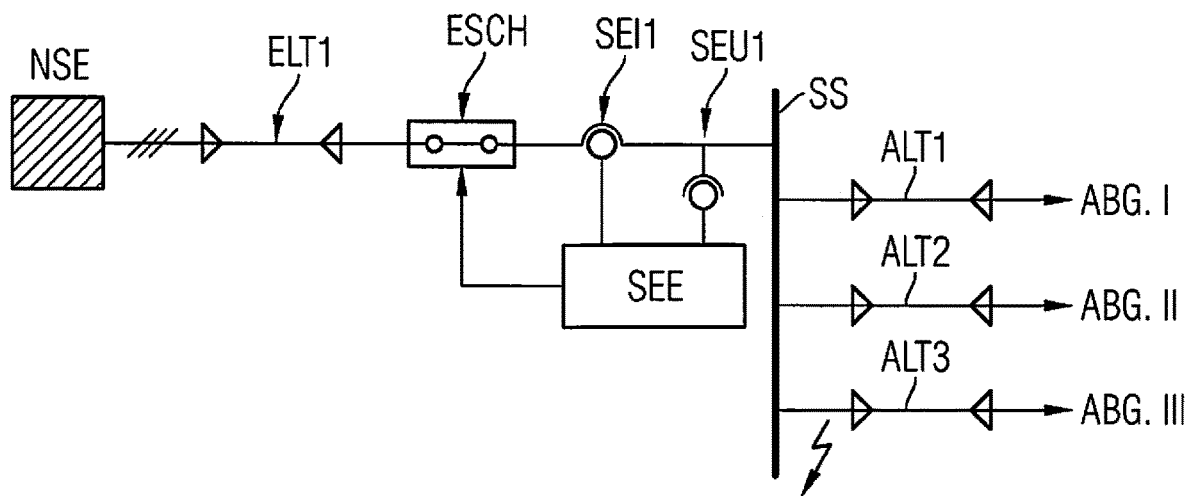
FIG. 5 shows a second depiction to explain the use of an embodiment of the invention.

FIG. 5 shows a further schematic depiction of an outline circuit diagram for an installation configuration with a central fault arc detection unit for detecting fault arcs. FIG. 5 shows a low voltage incoming unit NSE that is followed by a feeder cable ELT1, which is followed by an incoming-feeder disconnector ESCH, which is followed by a current sensor SEI1 and a voltage sensor SEU1, which is followed by a busbar SS. The busbar SS has three outgoing circuits ABG I, ABG II and ABG III provided on it. These each have an associated outgoing-circuit cable ALT1, ALT2, ALT3.

The sensors SEI1, SEU1 are connected to a fault arc detection unit SEE, the output of which is in turn connected to the incoming-feeder disconnector ESCH. The incoming-feeder disconnector may in this instance be a circuit breaker. When a fault arc is detected, the electrical circuit, i.e. the supply of power to the busbar SS, can be interrupted if a fault arc occurs in one of the outgoing circuits, for example.

Figure 6:
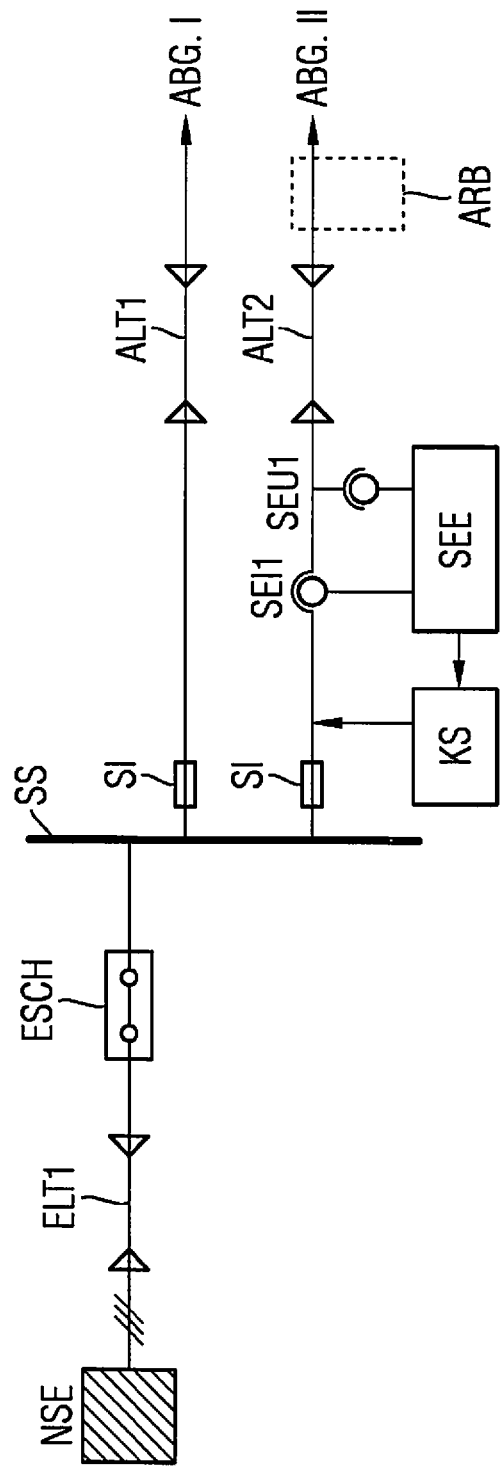
FIG. 6 shows a third depiction to explain the use of an embodiment of the invention.

FIG. 6 shows a depiction according to FIG. 5, with the difference that the sensors are arranged in the second outgoing circuit ABG II, which also has fuses SI and a short-circuiter KS. The sensors SEI1 and SEU1 detect current and voltage values of the outgoing circuit ABG II and forward the values to the fault arc detection unit SEE. If the fault arc detection unit SEE detects a fault arc, its output delivers a fault arc detection signal, which is transmitted to the short-circuiter KS. The latter then shorts the outgoing circuit ABG II in order to extinguish the fault arc.

The fault arc detection system according to FIG. 5 or 6 may be embodied as a mobile system, for example.

An embodiment of the invention will be explained once again below.

An embodiment of the invention can be used to detect fault arcs, in particular parallel or high-current fault arcs, in particular in low voltage switchgear and distribution installations. According to an embodiment of the invention, in particular a numerical solution or detection algorithm is available for this purpose on the basis of the evaluation of measured current values or signals. For the detection of fault arcs, the current is measured and is evaluated using a signal profile analysis. Owing to the fast arc detection required in practice, an extraordinarily fast temporal evaluation can be provided for this according to an embodiment of the invention.

An embodiment of the invention allows high-current fault arcs, for example in switchgear and distribution installations, e.g. in the low voltage, to be quickly detected on the basis of a central current measurement at the incoming unit, for example.

An embodiment of the invention can in particular be advantageously used in circuit breakers or short-circuiters.

Complex installation of optical fibers in installations for fault arc detection is not required. The current measurement can be realized centrally and if need be used synergistically by further resources.

Furthermore, implementation in existing switchgear and distribution installations is a simple matter, since a detection system according to an embodiment of the invention can be installed just centrally, for example, and there is no need for installation in individual cells that are to be protected.

An embodiment of the invention may be implemented as an assembly with central current measurement.

The detection systems established on the market to date are based on optical fault detection and therefore have potential for erroneous tripping as a result of the influence of extraneous light (e.g. flashlight). This hazard potential does not exist with the solution according to an embodiment of the invention based on a current measurement.

Although the invention has been illustrated and described in greater detail by the exemplary embodiment, the invention is not limited by the disclosed examples, and other variations can be derived therefrom by a person skilled in the art without departing from the scope of protection of the invention.

The invention claimed is:

1. A fault arc detection unit for a low-voltage electrical circuit, comprising:
   at least one current sensor, to periodically ascertain electrical current variables of the low-voltage electrical circuit, the at least one current sensor being connected to an evaluation unit, the evaluation unit being configured to
   compare a difference in current rise to a first threshold value or an compare the difference in current rise to a second threshold value, and
   deliver a fault arc detection signal upon the difference in current rise being above the first threshold value or below the second threshold value.

2. The fault arc detection unit of claim 1, wherein the electrical current variable periodically ascertained is at least one of an electrical current value, a value for a change in a electric current with respect to time a, an a difference quotient.

3. The fault arc detection unit of claim 2, wherein the difference quotient is subtracted from a preceding difference quotient to ascertain a difference in the difference quotients, as a measure of the difference in the current rise, the difference in the difference quotients being compared with the first threshold value, and wherein values of the difference in the difference quotients above the first threshold value result in the fault arc detection signal being delivered.

4. The fault arc detection unit of claim 2, wherein the difference quotient is subtracted from a preceding difference quotient, to ascertain a difference in the difference quotients, as a measure of the difference in the current rise, the difference in the difference quotients being compared with the second threshold value, and wherein values of the difference in the difference quotients below the second threshold value result in a fault arc detection signal being delivered.

5. The fault arc detection unit of claim 2, wherein the difference quotient is subtracted from a preceding difference quotient, a magnitude of the difference in the difference quotients ascertained, as a measure of the difference in the current rise, the difference in the difference quotients being compared with the first threshold value, and wherein values of the difference in the difference quotients above the first threshold value result in a fault arc detection signal being delivered.

6. The fault arc detection unit of claim 2, wherein, upon the electrical current value being ascertained electrical current variables, then the value for a change in the electric current with respect to time, or the difference quotient, is calculated from the electrical current value ascertained.

7. The fault arc detection unit of claim 6, wherein, upon current values being ascertained as the electrical current variables, then a current difference is continually ascertained from two temporally successive current values, and the current difference is divided by a difference in the current values with respect to time to ascertain a difference quotient as a value for the change in the electric current with respect to time.

8. A circuit breaker for a low voltage electrical circuit, comprising the fault arc detection unit of claim 2, connected to the circuit breaker, the fault arc detection unit being configured such that delivery of the fault arc detection signal results in the circuit breaker tripping to interrupt the electrical circuit.

9. A short-circuiter, comprising the fault arc detection unit of claim 2, connected to the short-circuiter, the fault arc detection unit being configured such that delivery of the fault arc detection signal results in the short-circuiter shorting the electrical circuit to cause extinguishing of the fault arc.

10. The fault arc detection unit of claim 1, wherein, upon an electrical current value being ascertained as the electrical current variables, then a value for a change in the electric current with respect to time, or difference quotient, is calculated from the electrical current value ascertained.

11. The fault arc detection unit of claim 10, wherein, upon current values being ascertained as the electrical current variables, then a current difference is continually ascertained from two temporally successive current values, and the current difference is divided by a difference in the current values with respect to time to ascertain a difference quotient as a value for the change in the electric current with respect to time.

12. The fault arc detection unit of claim 10, wherein the difference quotient is subtracted from a preceding difference quotient to ascertain a difference in the difference quotients, as a measure of the difference in the current rise, the difference in the difference quotients being compared with the first threshold value, and wherein values of the difference in the difference quotients above the first threshold value result in the fault arc detection signal being delivered.

13. The fault arc detection unit of claim 10, wherein the difference quotient is subtracted from a preceding difference quotient, to ascertain a difference in the difference quotients, as a measure of the difference in the current rise, the difference in the difference quotients being compared with the second threshold value, and wherein values of the difference in the difference quotients below the second threshold value result in a fault arc detection signal being delivered.

14. The fault arc detection unit of claim 10, wherein the difference quotient is subtracted from a preceding difference quotient, a magnitude of the difference in the difference quotients ascertained, as a measure of the difference in the current rise, the difference in the difference quotients being compared with the first threshold value, and wherein values of the difference in the difference quotients above the first threshold value result in a fault arc detection signal being delivered.

15. The fault arc detection unit of claim 1, wherein the current variable is compared with a third threshold value, and wherein only values electrical current variables above the third threshold value result in a fault arc detection signal being delivered.

16. A circuit breaker for a low voltage electrical circuit, comprising the fault arc detection unit of claim 1, connected to the circuit breaker, the fault arc detection unit being configured such that delivery of the fault arc detection signal results in the circuit breaker tripping to interrupt the electrical circuit.

17. A short-circuiter, comprising the fault arc detection unit of claim 1, connected to the short-circuiter, the fault arc detection unit being configured such that delivery of the fault arc detection signal results in the short-circuiter shorting the electrical circuit to cause extinguishing of the fault arc.

18. A method for fault-arc detection for an electrical circuit, comprising:
   periodically ascertaining electrical current variables;
   comparing a difference in a current rise, of the electrical voltage values periodically ascertained, to a first threshold value;
   comparing the difference in the current rise, of the electrical voltage values periodically ascertained, to a second threshold value; and
   delivering a fault arc detection signal upon the comparing indicating the difference in the current rise, of the electrical voltage values periodically ascertained, being above the first threshold or below the second threshold.

19. The method of claim 18, wherein the electrical current variables ascertained include at least one of electrical current values, values for changes in electric current with respect to time, and difference quotients, and wherein, upon the electrical current variable including the electrical current values, then the values for the change in the electric current with respect to time, or the difference quotients, are calculated from the electrical current values.

20. The method of claim 19, wherein, upon the electrical current variables ascertained including current values, then current differences are continually ascertained from two temporally successive current values, and the current differences are divided by the difference in the current values with respect to time to obtain difference quotients as a value for the change in the electric current with respect to time.

21. The method of claim 20, wherein the difference quotient is subtracted from a preceding difference quotient, tan ascertained difference in the difference quotients or a magnitude thereof, as the difference in the current rise, is compared with the first threshold value, and values above the first threshold value result in the fault arc detection signal being delivered.

22. The method of claim 18, wherein the fault arc detection signal is used to interrupt or short the electrical circuit.

23. The method of claim 18, wherein the electrical current variable is compared with a third threshold value, and only electrical current variable above the third threshold value result in a fault arc detection signal being delivered.

* * * * *